(12) United States Patent
Granik et al.

(10) Patent No.: US 8,799,832 B1
(45) Date of Patent: Aug. 5, 2014

(54) OPTICAL PROXIMITY CORRECTION FOR TOPOGRAPHICALLY NON-UNIFORM SUBSTRATES

(71) Applicant: Mentor Graphics Corporation, Wilsonville, OR (US)

(72) Inventors: Yuri Granik, Palo Alto, CA (US); Uwe Hollerbach, Fremont, CA (US); Konstantinos Adam, Belmont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/763,292

(22) Filed: Feb. 8, 2013

(51) Int. Cl.
*G06F 17/50* (2006.01)
*G03F 7/20* (2006.01)
*G03F 1/36* (2012.01)

(52) U.S. Cl.
CPC ........ *G06F 17/5081* (2013.01); *G03F 7/70441* (2013.01); *G03F 1/36* (2013.01)
USPC .......................................................... 716/53

(58) Field of Classification Search
None
See application file for complete search history.

(56) References Cited

U.S. PATENT DOCUMENTS

| | | | |
|---|---|---|---|
| 5,994,009 A | 11/1999 | Tzu et al. | |
| 7,467,072 B2 * | 12/2008 | Adam | 703/2 |
| 2013/0205263 A1 * | 8/2013 | Lan | 716/52 |

OTHER PUBLICATIONS

Sato et al., "Alignment mark signal simulation system for the optimum mark feature selection," J. Microlith., Microfab., Microsyst. vol. 4, No. 2, Apr.-Jun. 2005, 6 pages.*
"Model based OPC for implant layer patterning considering wafer topography proximity (W3D) effects," Park et al., Proceedings of SPIE, vol. 8326, 2012.
"A full-chip 3D computational lithography framework," Liu et al, Proceedings of SPIE, Vol. vol. 8326, 2012.
"Wafer topography proximity effect modeling and correction for implant layer patterningl," Song et al., Proceedings of SPIE, vol. 7488, 2009.
"Virtual fab flow for wafer topography aware OPC", Stock et al., Proceedings of SPIE, vol. 7640, 2010.
"Substrate aware OPC rules for edge effect in block levels", Shao, Proceedings of SPIE, vol. 7823, 2010.

* cited by examiner

*Primary Examiner* — Leigh Garbowski

(57) ABSTRACT

Aspects of the invention relate to techniques of optical simulation for topographically non-uniform substrates. A layout design is simulated to generate an aerial image based on optical models for different types of substrates and for transition regions, along with models for one or more categories of light signals. The one or more categories of light signals comprise trench side-wall reflection signals, trench radiation signals, and trench corner diffraction signals. The one or more categories of light signals may further comprise gate scattering signals and interconnect scattering signals. The models for the one or more categories of light signals may be calibrated with experimental data.

20 Claims, 7 Drawing Sheets

Flow chart
700

Flow chart
700

OPTICAL PROXIMITY CORRECTION FOR TOPOGRAPHICALLY NON-UNIFORM SUBSTRATES

FIELD OF THE INVENTION

The present invention relates to photolithographic processing technologies. Various implementations of the invention may be particularly useful for model-based optical proximity correction for implant layer patterning.

BACKGROUND OF THE INVENTION

In integrated circuit (IC) device fabrication, the device components are formed and connected layer by layer. To pattern each layer, photoresist is exposed to light patterns that are formed by a photomask and an optical projection system. The light intensity distribution in the photoresist induces chemical reactions that change the solubility of the photoresist during development and thus determines the final pattern transfer onto the wafer.

With the exception of the first layer which is patterned on planar and uniform wafer surface, the subsequent layers are patterned on non-planar and non-uniform wafer stacks. To minimize the non-uniform back reflection, a bottom anti-reflection coating (BARC) layer is often used underneath the photoresist for critical layer patterning. Critical layers include isolation, gate and contact layers. The feature dimensions of critical layers are usually much larger than those of non-critical layers. A typical non-critical layer is the implant layer. In non-critical layer patterning, the BARC is not desired due to cost and technical concerns. Additional process steps associated with the BARC can not only increase the cost but also lower wafer throughput and yield. Because of the BARC thickness variation along the uneven topographic features, it is difficult to remove the BARC with the traditional dry-etch technique. The highly energetic ions used for dry-etching can also affect the implant and diffusion process. While wet-developable organic BARC materials have been invented, the BARC clearing process is so complex that reduces wafer throughput and thus not practical.

Up to the 45 nm node, critical dimension variations due to non-uniform back reflection can be neglected or addressed by rule-based optical proximity correction techniques. As the technology node shrinks to 40 nm and below, however, these variations need to be addressed by model-based optical proximity correction techniques.

BRIEF SUMMARY OF THE INVENTION

Aspects of the invention relate to techniques of optical simulation for topographically non-uniform substrates. A layout design is simulated to generate an aerial image based on optical models for a plurality of substrate types, one or more optical models for transition regions and models for one or more categories of light signals. The plurality of substrate types comprise some or all of silicon, silicon oxide, FinFET silicon and fully depleted silicon on insulator. The optical models for the plurality of substrate types can be constructed by using conventional modeling. The one or more optical models for transition regions may be constructed by interpolation. The one or more categories of light signals comprise trench side-wall reflection signals, trench radiation signals, and trench corner diffraction signals. The one or more categories of light signals may further comprise gate scattering signals and interconnect scattering signals. The models for some or all of these signals may employ Gauss-Laguerre functional bases. Other functional bases may also be used. The models for the one or more categories of light signals may be calibrated with experimental data obtained by vigorous simulation techniques or by real measurement.

DETAILED DESCRIPTION OF THE INVENTION

Figure 1:
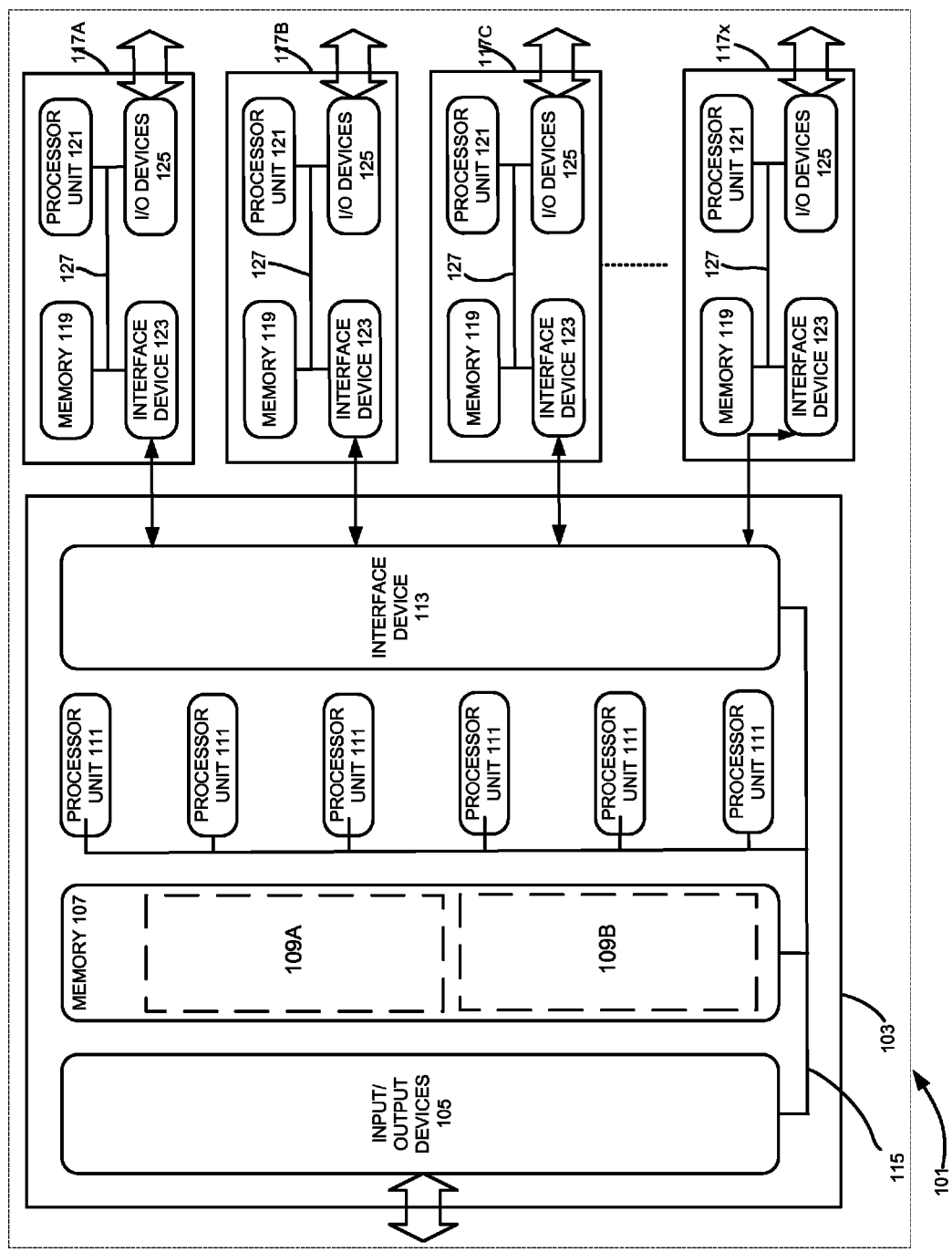
FIG. 1 illustrates an example of a computing system that may be used to implement various embodiments of the invention.

Various aspects of the present invention relate to optical simulation for topographically non-uniform substrates. In the following description, numerous details are set forth for purpose of explanation. However, one of ordinary skill in the art will realize that the invention may be practiced without the use of these specific details. In other instances, well-known features have not been described in details to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "construct" and "perform" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool (e.g., an automatic test pattern generation ("ATPG") tool). Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit. Furthermore, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device. Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Exemplary Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
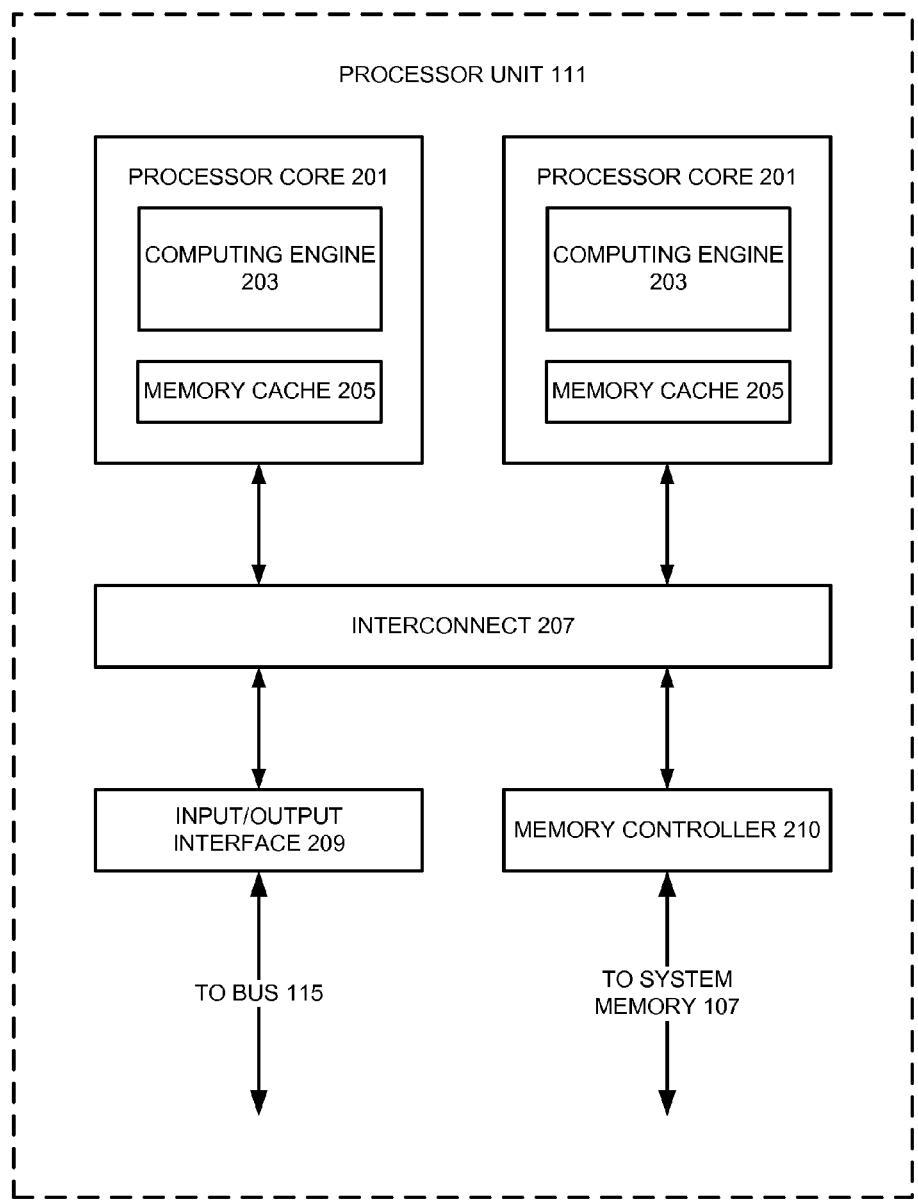
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 210. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Modeling Non-Uniform Reflection

The wafer structure of pre-gate implant layer has active silicon (RX) and silicon oxide shallow trench isolation (STI) patterns. Both materials can cause light reflection and scattering back to the photoresist layer and alter the aerial image formed by the photomask patterns. Different material indices of refraction and layer structures will lead to non-uniform reflection and thus different critical dimensions (CDs). The non-uniform reflection may be modeled by rigorous approaches involving solving Maxwell equations by, for example, either the finite-difference time-domain method or the rigorous coupled wave analysis method. Such approaches, however, can only simulate very small regions with reasonable computing resources. To achieve fast OPC throughput, optical models and customized signals are developed to incorporate non-uniform wafer substrate effects into model-based OPC for mask simulation and correction.

The aerial image can be calculated by using optical models. Two of these optical models take into account the reflection from silicon and silicon oxide, respectively. These two models can be constructed using conventional modeling. Regions in the vicinity of the silicon/silicon oxide boundary may be addressed by one or more transitional optical models. One transitional optical model may be constructed by interpolating light intensity from those calculated by the silicon and silicon oxide optical models. Another transitional optical model may be constructed by interpolating light field from those calculated by the silicon and silicon oxide optical models. The former may be used where the depth of a trench is small and the light interference is small.

Figure 3:
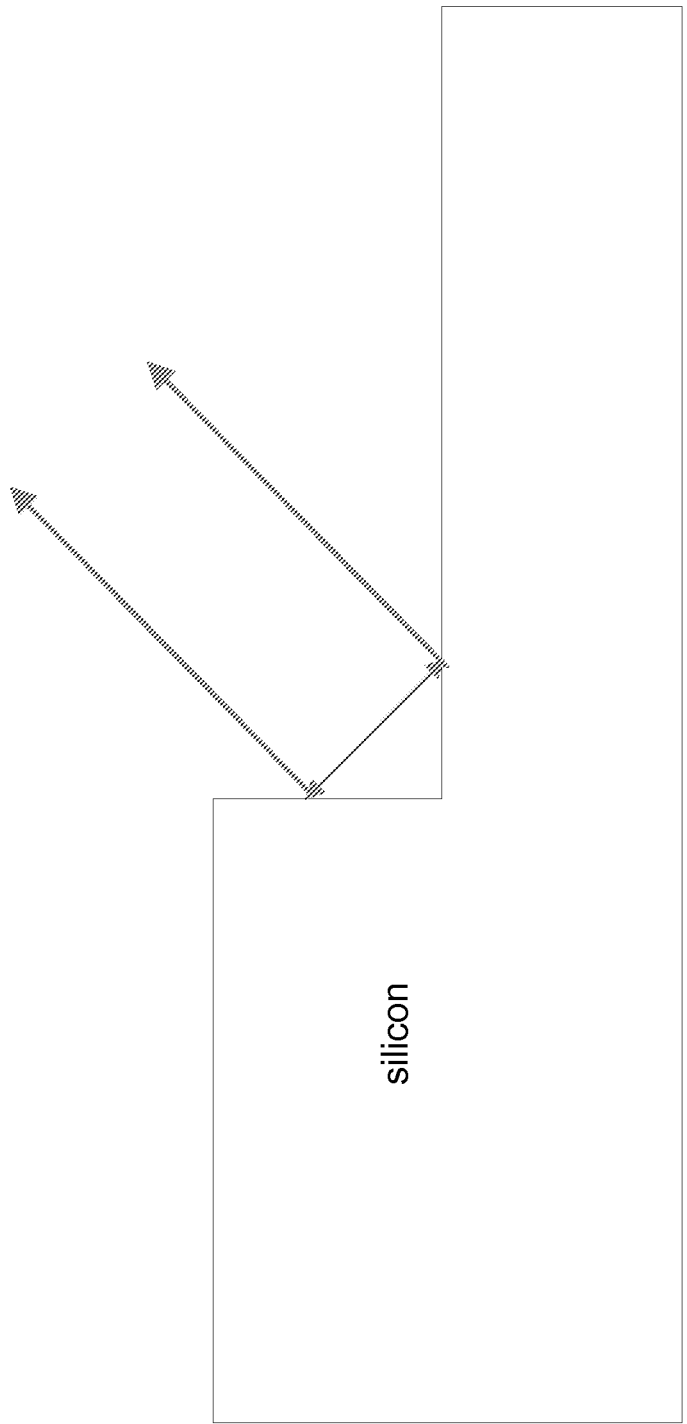
FIG. 3 illustrates an example of side wall reflection signals.

In addition to the above optical models, multiple categories of light signals are constructed heuristically to model light diffraction/scattering from various wafer stack patterns. The first category of light signals is called side wall reflection signals. FIG. 3 illustrates an example of side wall reflection signals. In the figure, light rays are reflected twice at the silicon/silicon oxide interface: one at the side wall and the other at the bottom of the trench. Side wall reflection signals are a function of the height of the step (the depth of the trench) and can be used to calculate their contribution to the aerial image in the following form:

$$I(x, y) = \sum_i \oint_{c_i} R(n(c), \zeta(c), \eta(c); x, y) F[I_{incident}(\zeta(c), \eta(c))] dc \quad (1)$$

where $I_{incident}(\zeta(c),\eta(c))$ is the intensity of the incident waves that is given by optical models without substrate reflection and $R(r,\theta)$ represents side wall reflection signals $$R(r, \theta) = \sum_{p=0,\ldots,l=0,\ldots} c_{p,l} G(s, p, l; r, \theta) \quad (2)$$

$$G(s, p, l; r, \theta) = \sqrt{\frac{2p!}{\pi(|l|+p)!}} \frac{1}{s} \left(\frac{\sqrt{2}\,r}{s}\right)^{|l|} \exp\left(-\frac{r^2}{s^2}\right) L_p^l\left(\frac{2r^2}{s^2}\right) \cos(l\theta)$$

$G(s,p,l;r,\theta)$ is the ortho-normal Gauss-Laguerre functional base. With some implementations of the invention, only the first 8 bases are used:

$$R(r, \theta) = \sum_{\substack{p=0,1,2,3 \\ l=0,1}} c_{p,l} G(s, p, l; r, \theta) \quad (3)$$

Functional form of operator F may be identity $F[I]=I$, or constant $F[I]=\text{const}$, zero order of intensity spectrum, $F[I]=\text{zeroorder}(I)$.

The coefficients $c_{p,l}$ can be obtained by calibration against (or fitting) data generated by rigorous simulation or real measurement data. It should noted that even though the orthonormal Gauss-Laguerre functional base is used here, other base functions can be employed as well.

Figure 4:
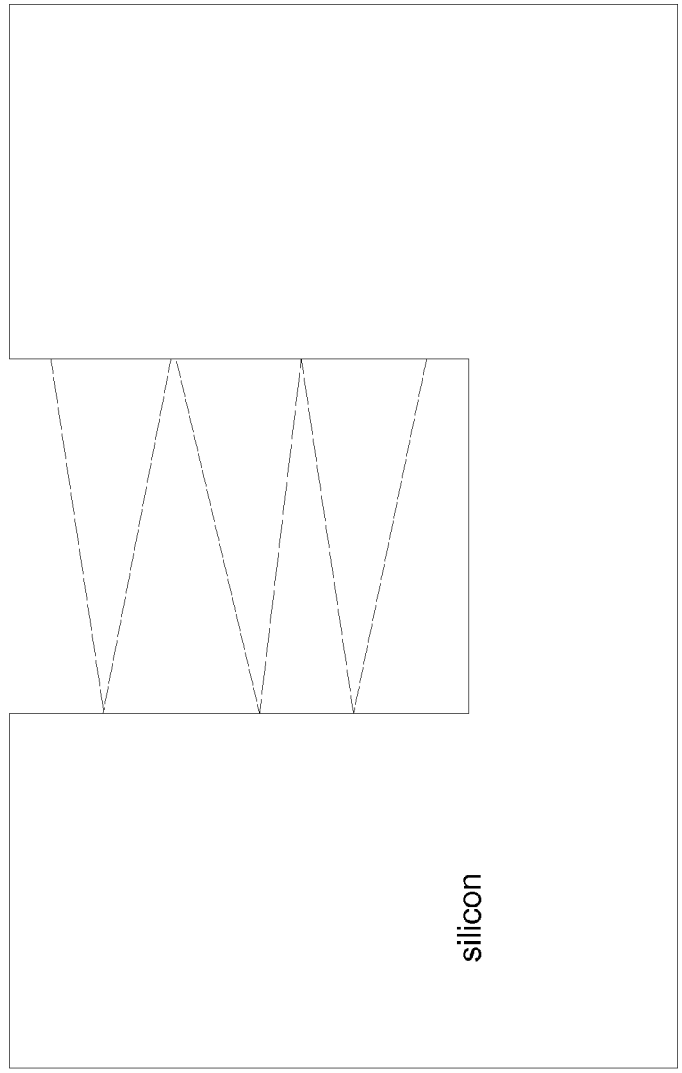
FIG. 4 illustrates an example of trench radiation signals.

The second category of light signals is called trench radiation signals. FIG. 4 illustrates an example of trench radiation signals. These signals come from narrow silicon oxide trenches and are dependent upon the widths of the trenches. These crosstalk signal can be formulated similarly as:

$$I_{talk}(x, y) \sum_{z=x,y} \int\int_{T_z} T(n_z; x-\zeta, y-\eta) F[I_{incident}(\zeta, \eta)] d\zeta d\eta \quad (4)$$

where $T(n;x,y)$ is crosstalk signal that comprises first 8 even Gauss-Laguerre bases: (51

$$T(r, \theta) = \sum_{\substack{p=0,1,2,3 \\ l=0,2}} e_{p,l} G(s, p, l; r, \theta) \quad (5)$$

and rotated into direction n. Again, coefficients $e_{p,l}$ are fit to explain experimental data, either virtual or real.

Figure 5:
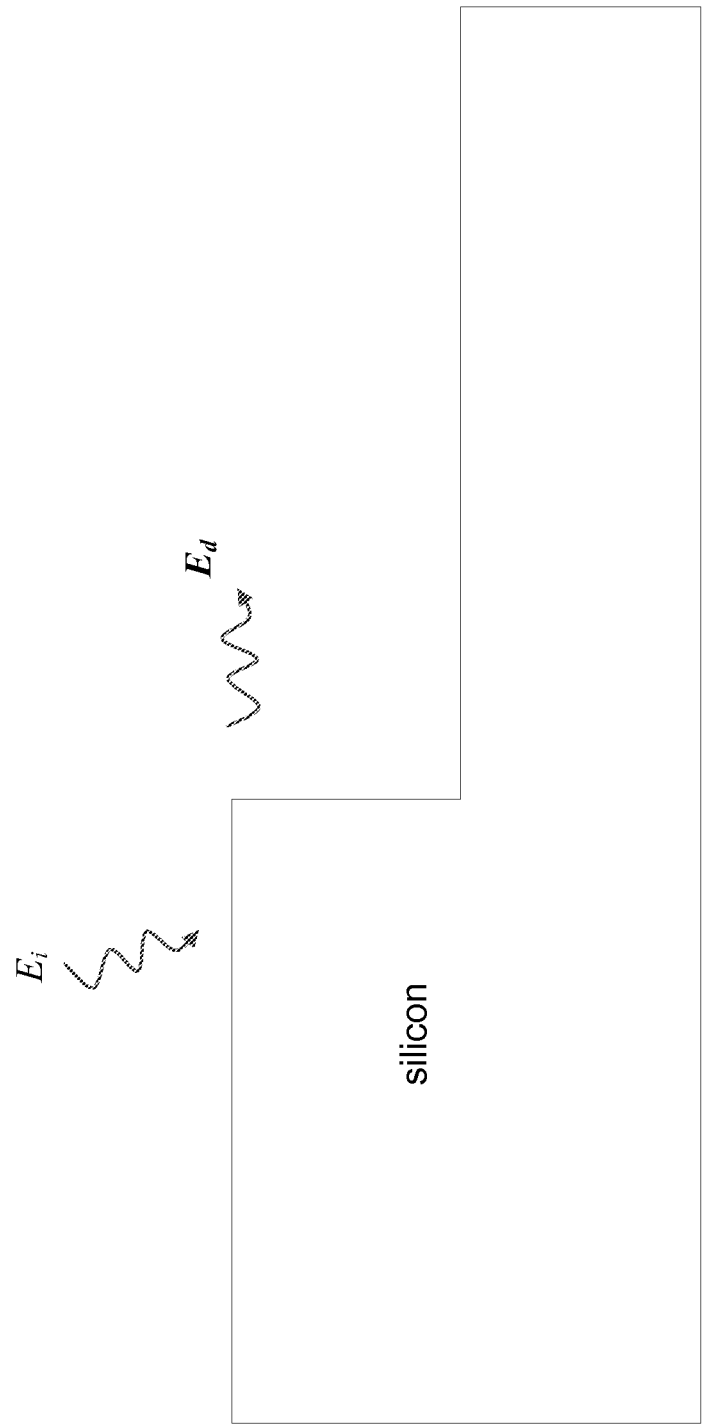
FIG. 5 illustrates an example of corner diffraction signals.

The third category of light signals is called corner diffraction signals. FIG. 5 illustrates an example of corner diffraction signals. The diffraction on a step brings into picture effects that cannot be captured by geometrical optics and pupil modifications. The incident wave according to Huygens principle generates secondary sources on top of silicon. Interference of these sources creates surface-diffracted wave $E_d$:

$$E_i = A_i(\alpha) e^{-2\pi i \cdot \frac{1}{\lambda}(n_z z + n_x x)} = A_i(\alpha) e^{-i(k_z z + k_x x)}$$

$$dE_d = C(n, n_3, \alpha) f(x - x_0) A_i(\alpha) e^{-ik_x x_0} e^{-ik(x-x_0)} dx_0$$

$$k^2 = k_z^2 + k_x^2$$

Here $C(n,n_3,\alpha)$ is diffraction coefficient in the direction of x, $f(x-x_0)$ is point-source kernel, x is coordinate of the POI. For small $k_x$ (including 0-order $k_x=0$) we get convolution:

$$dE_d \approx C(n, n_3) f(x - x_0) A_i(\alpha) e^{-ik(x-x_0)} dx_0$$

$$E_d = C(n, n_3) A_i(\alpha) \int_A^B f(x - x_0) e^{-ik(x-x_0)} dx_0 = C(n, n_3) A_i(\alpha) K(x) \otimes S(x)$$

where convolution kernel $$K(x) = f(x) e^{-ikx}$$

and $$S(x) = \begin{cases} 1, & \text{inside } RX \\ 0, & \text{outside } RX \end{cases}$$

is characteristic function of SILICON regions. The convolution kernel has certain "sharpness" and "waviness" that is defined by the shape of $$f(x) e^{-ikx} \sim e^{-ikx} \sim \cos(kx) = \cos\left(2\pi \frac{x}{\lambda}\right)$$

The heuristic Gauss-Laguerre bases match this sharpness when
p=6, l=0, λ=s; p=4, l=0, s=0.8λ; p=2, l=0, s=0.6λ; and p=0, l=0, s=0.25λ

The diffracted electrical field interferes with the incident field, mainly zero order, which produces the following addition to the main image intensity:

$$I_d = |E_d + E_i(\alpha = 0)|^2 =$$
$$|A_i(\alpha = 0)|^2 \{1 + 2\mathrm{Re}[C(n, n_3)]K(x) \otimes S(x) + |C(n, n_3)|^2(K(x) \otimes S(x))^2\}$$

or in 2D:

$$I_d(x,y) = |A_i(\alpha=0)|^2 \{1+2Re[C(n,n_3)]K(x,y) \otimes S(x,y)+|C(n,n_3)|^2(K(x,y) \otimes S(x,y))^2\}$$

$A_i(\alpha=0)$ is the amplitude of zero order on the wafer. For coherent illumination, this is equal to the zero order of visible mask. For standard illumination, we have to integrate all mask orders can be shifted into normal incidence.

The constant term will be taken care of during regular optical model simulations, so the differential signal to be added to the main intensity is:

$$\Delta I_d(x, y) = |A_i(\alpha = 0)|^2$$
$$\{2\mathrm{Re}[C(n, n_3)]K(x, y) \otimes S(x, y) + |C(n, n_3)|^2(K(x, y) \otimes S(x, y))^2\}$$

where the kernel K can be decomposed into GL bases:

$$K(r) = \sum_{p=0,\ldots,7} d_p G(s, p, l = 0; r) \qquad (6)$$

where 8 coefficients $d_p$ are found by fitting experimental data, either virtual or real.

Two other categories of light signals, called gate scattering signals and interconnect scattering signals, may also be considered. These two signals arise due to a polysilicon layer. Gate scattering signals are associated with polysilicon patterns that are above silicon while interconnect scattering signals are associated with polysilicon patterns that are above silicon oxide. These two signals can also be modeled by using Gauss-Laguerre bases, similar to Eqs. (3), (5) and (6). As will be appreciated by a person of ordinary skill in the art, other base functions can be employed as well.

The final aerial image intensity may be calculated by summing all image intensities calculated with all of the optical models and the light signal models. Other forms may be adopted as well. For example, a sum of the square root of the aerial image light intensities calculated with all of the optical models and the signals. The final aerial image intensity is the derived sum to the power of two.

Simulation Tool and Methods

Figure 6:
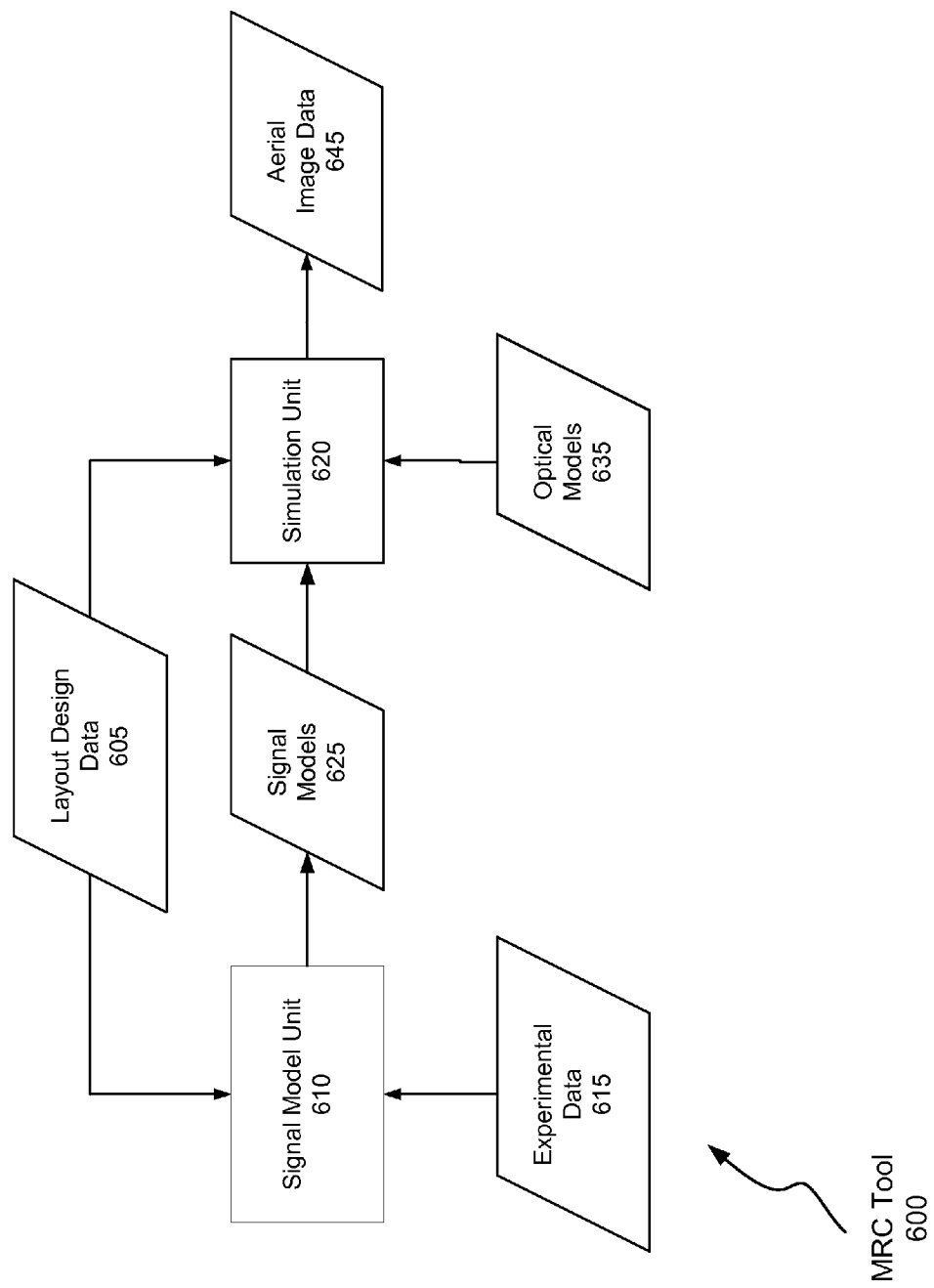
FIG. 6 illustrates an example of a simulation tool that may be implemented according to various embodiments of the invention.

FIG. 6 illustrates an example of a simulation tool 600 that may be implemented according to various embodiments of the invention. As seen in this figure, the simulation tool 600 includes a signal model unit 610 and a simulation unit 620. The signal model unit 610 builds signal models 625 based on layout design data and experimental data 615. The simulation unit 620 then performs simulation on the layout design data 605 based on the signal models 625 and optical models 635 to generate aerial image data 645.

According to some embodiments of the invention, one or both of the signal model unit 610 and the simulation unit 620 are implemented by one or two computing systems, such as the computing system illustrated in FIGS. 1 and 2, executing programmable instructions. Correspondingly, some other embodiments of the invention may be implemented by software-executable instructions, stored on a non-transitory computer-readable medium, for instructing a computing system to perform functions of one or both of the signal model unit 610 and the simulation unit 620. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 7:
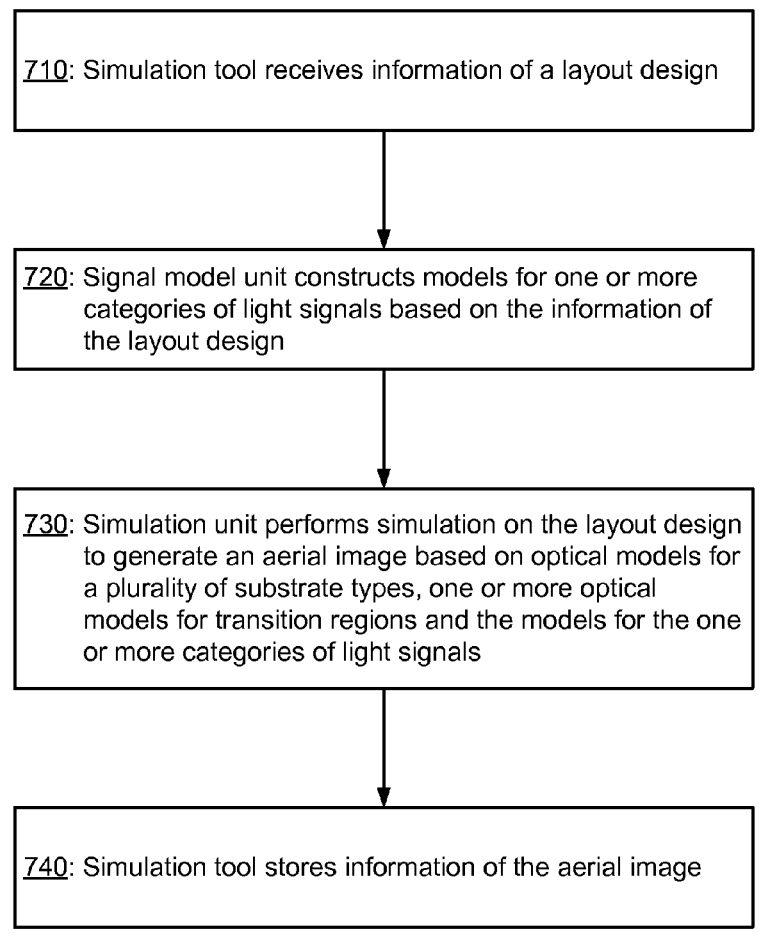
FIG. 7 illustrates a flow chart describing a method of optical simulation for topographically non-uniform substrates that may be employed according to various embodiments of the invention.
Figure 7:

For ease of understanding, methods of optical simulation for topographically non-uniform substrates that may be employed according to various embodiments of the invention will be described with reference to the simulation tool 600 in FIG. 6 and the flow chart 700 illustrated in FIG. 7. It should be appreciated, however, that alternate implementations of a simulation tool may be used to perform the methods of optical simulation for topographically non-uniform substrates illustrated by the flow chart 700 according to various embodiments of the invention. Likewise, the simulation tool 600 may be employed to perform other methods of optical simulation for topographically non-uniform substrates according to various embodiments of the invention.

Initially, in operation 710 of the flowchart 700, the simulation tool 600 receives information of a layout design. The layout design corresponds to at least a portion of an integrated circuit.

Next, in operation 720, the signal model unit 610 constructs models for one or more categories of light signals based on the information of the layout design. The one or more categories of light signals comprise trench side-wall reflection signals, trench radiation signals, and trench corner diffraction signals, which are discussed in the previous section. The one or more categories of light signals may further comprise gate scattering signals and interconnect scattering signals. The models for some or all of these signals may employ Gauss-Laguerre functional bases. These models may be calibrated with experimental data obtained by vigorous simulation techniques or by measuring real data.

Next, in operation 730, the simulation unit 620 performs simulation on the layout design to generate an aerial image based on optical models for a plurality of substrate types, one or more optical models for transition regions and the models for the one or more categories of light signals. The plurality of substrate types comprise some or all of silicon, silicon oxide, FinFET silicon and fully depleted silicon on insulator. The optical models for the plurality of substrate types can be constructed by using conventional modeling. One transitional optical model may be constructed by interpolating light intensity from those calculated by, for example, the silicon and silicon oxide optical models. Another transitional optical model may be constructed by interpolating light field from those calculated by, for example, the silicon and silicon oxide optical models. The simulation unit 620 may calculate a weighted sum of all the light contributions. The weighting factors may be determined heuristically.

In operation 740, the simulation tool 600 stores aerial image information.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. One or more non-transitory computer-readable media storing computer-executable instructions for causing one or more processors to perform a method, the method comprising:
   receiving information of a layout design, the layout design corresponding to at least a portion of an integrated circuit;
   constructing models for one or more categories of light signals based on the information of the layout design, the one or more categories of light signals comprising trench side-wall reflection signals, trench radiation signals, and trench corner diffraction signals;
   performing simulation on the layout design to generate an aerial image based on optical models for a plurality of substrate types, one or more optical models for transition regions and the models for the one or more categories of light signals; and
   storing information of the aerial image.

2. The one or more non-transitory computer-readable media recited in claim 1, wherein the plurality of substrate types comprise silicon and silicon oxide.

3. The one or more non-transitory computer-readable media recited in claim 1, wherein the one or more categories of light signals further comprises gate scattering signals and interconnect scattering signals.

4. The one or more non-transitory computer-readable media recited in claim 1, wherein one of the one or more optical models for transition regions is constructed based on light intensity interpolation.

5. The one or more non-transitory computer-readable media recited in claim 1, wherein one of the one or more optical models for transition regions is constructed based on light field interpolation.

6. The one or more non-transitory computer-readable media recited in claim 1, wherein the models for some or all of the one or more categories of light signals employ Gauss-Laguerre functional bases.

7. The one or more non-transitory computer-readable media recited in claim 1, wherein the constructing comprises calibrating signal models with experimental data.

8. A method, comprising:
   with a computer,
   receiving information of a layout design, the layout design corresponding to at least a portion of an integrated circuit;
   constructing models for one or more categories of light signals based on the information of the layout design, the one or more categories of light signals comprising trench side-wall reflection signals, trench radiation signals, and trench corner diffraction signals;
   performing simulation on the layout design to generate an aerial image based on optical models for a plurality of substrate types, one or more optical models for transition regions and the models for the one or more categories of light signals; and
   storing information of the aerial image.

9. The method recited in claim 8, wherein the plurality of substrate types comprise silicon and silicon oxide.

10. The method recited in claim 8, wherein the one or more categories of light signals further comprises gate scattering signals and interconnect scattering signals.

11. The method recited in claim 8, wherein one of the one or more optical models for transition regions is constructed based on light intensity interpolation.

12. The method recited in claim 8, wherein one of the one or more optical models for transition regions is constructed based on light field interpolation.

13. The method recited in claim 8, wherein the models for some or all of the one or more categories of light signals employ Gauss-Laguerre functional bases.

14. The method recited in claim 8, wherein the constructing comprises calibrating signal models with experimental data.

15. A system comprising:
   one or more processors, the one or more processors programmed to perform a method, the method comprising:
   receiving information of a layout design, the layout design corresponding to at least a portion of an integrated circuit;
   constructing models for one or more categories of light signals based on the information of the layout design, the one or more categories of light signals comprising trench side-wall reflection signals, trench radiation signals, and trench corner diffraction signals;
   performing simulation on the layout design to generate an aerial image based on optical models for a plurality of substrate types, one or more optical models for transition regions and the models for the one or more categories of light signals; and
   storing information of the aerial image.

16. The system recited in claim 15, wherein the plurality of substrate types comprise silicon and silicon oxide.

17. The system recited in claim 15, wherein the one or more categories of light signals further comprises gate scattering signals and interconnect scattering signals.

18. The system recited in claim 15, wherein one of the one or more optical models for transition regions is constructed based on light intensity interpolation.

19. The system recited in claim 15, wherein one of the one or more optical models for transition regions is constructed based on light field interpolation.

20. The system recited in claim 15, wherein the models for some or all of the one or more categories of light signals employ Gauss-Laguerre functional bases.

* * * * *